United States Patent
Shi et al.

(10) Patent No.: US 11,326,076 B2
(45) Date of Patent: May 10, 2022

(54) SHALLOW TRENCH ISOLATION (STI) CHEMICAL MECHANICAL PLANARIZATION (CMP) POLISHING WITH LOW ABRASIVE CONCENTRATION AND A COMBINATION OF CHEMICAL ADDITIVES

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 0 days.

(21) Appl. No.: 16/737,083

(22) Filed: Jan. 8, 2020

(65) Prior Publication Data

US 2020/0239735 A1    Jul. 30, 2020

Related U.S. Application Data

(60) Provisional application No. 62/796,786, filed on Jan. 25, 2019.

(51) Int. Cl.
*C09G 1/02* (2006.01)
*C09K 3/14* (2006.01)
*H01L 21/3105* (2006.01)

(52) U.S. Cl.
CPC .............. *C09G 1/02* (2013.01); *C09K 3/1436* (2013.01); *H01L 21/31053* (2013.01)

(58) Field of Classification Search
CPC ..... C09G 1/02; C09K 3/1436; H01L 21/3212; H01L 21/30625; H01L 21/31053; H01L 21/02164; H01L 21/0217; H01L 21/31051; B24B 37/044
USPC .... 252/79.1, 79.2, 79.3, 79.4; 438/691, 692, 438/693, 694
See application file for complete search history.

(56) References Cited

U.S. PATENT DOCUMENTS

| | | |
|---|---|---|
| 5,876,490 A | 3/1999 | Ronay |
| 6,544,892 B2 | 4/2003 | Srinivasan et al. |
| 6,616,514 B1 | 9/2003 | Edelbach |
| 6,914,001 B2 | 7/2005 | Lee |
| 6,964,923 B1 | 11/2005 | Ronay |
| 6,984,588 B2 | 1/2006 | Grover et al. |
| 7,247,082 B2 | 7/2007 | Yoshida et al. |
| 8,778,203 B2 | 7/2014 | Dandu et al. |
| 2002/0039875 A1 | 4/2002 | Kobayashi et al. |
| 2006/0215077 A1* | 9/2006 | Majumdar ............. B82Y 10/00 349/88 |
| 2009/0261291 A1* | 10/2009 | Banerjee ........... H01L 21/32125 252/79.1 |
| 2012/0021675 A1 | 1/2012 | Matsui et al. |
| 2012/0077419 A1 | 3/2012 | Zhang et al. |
| 2015/0102012 A1 | 4/2015 | Reiss et al. |
| 2016/0160083 A1* | 6/2016 | Lauter .................. C09K 3/1463 252/79.1 |
| 2019/0080927 A1* | 3/2019 | Izawa .................. C09K 3/1463 |

FOREIGN PATENT DOCUMENTS

| | | |
|---|---|---|
| CN | 102337084 A | 2/2012 |
| JP | 2008244316 | 10/2008 |
| TW | 201043686 | 12/2010 |
| WO | 2006001558 A1 | 1/2006 |
| WO | 2006119249 A2 | 11/2006 |
| WO | 2012032461 A1 | 3/2012 |

* cited by examiner

*Primary Examiner* — Lan Vinh
(74) *Attorney, Agent, or Firm* — Daniel C. Roth

(57) ABSTRACT

Shallow Trench Isolation (STI) chemical mechanical planarization (CMP) polishing compositions, methods and systems of use therefore are provided. The CMP polishing composition comprises abrasives of ceria coated inorganic metal oxide particles, such as ceria-coated silica; and dual chemical additives for providing high oxide film removal rate. The dual chemical additives comprise gelatin compounds possessing negative and positive charges on the same molecule, and non-ionic organic molecules having multi hydroxyl functional groups in the same molecule.

24 Claims, No Drawings

SHALLOW TRENCH ISOLATION (STI) CHEMICAL MECHANICAL PLANARIZATION (CMP) POLISHING WITH LOW ABRASIVE CONCENTRATION AND A COMBINATION OF CHEMICAL ADDITIVES

CROSS REFERENCE TO RELATED PATENT APPLICATIONS

The application claims the benefit of U.S. Application No. 62/796,786 filed on Jan. 25, 2019. The disclosure of Application No. 62/796,786 is hereby incorporated by reference.

BACKGROUND OF THE INVENTION

This invention relates to the Shallow Trench Isolation (STI) chemical mechanical planarization (CMP) compositions and chemical mechanical planarization (CMP) methods, systems having high oxide film removal rate for Shallow Trench Isolation (STI) process.

In the fabrication of microelectronics devices, an important step involved is polishing, especially chemical-mechanical polishing surfaces for recovering a selected material and/or planarizing the structure.

For example, a SiN layer is deposited under a $SiO_2$ layer to serve as a polish stop layer. The role of such polish stop is particularly important in Shallow Trench Isolation (STI) structures. Selectivity is characteristically expressed as the ratio of the oxide polish rate to the nitride polish rate. An example is an increased polishing selectivity rate of silicon dioxide ($SiO_2$) as compared to silicon nitride (SiN).

In the global planarization of patterned STI structures, reducing SiN film removal rates and reducing oxide trench dishing are two key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876, 490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

U.S. Pat. No. 6,984,588 discloses a chemical mechanical polishing composition comprising a soluble cerium compound at a pH above 3 and a method to selectively polish a silicon oxide overfill in preference to a silicon nitride film layer in a single step during the manufacture of integrated circuits and semiconductors.

U.S. Pat. No. 6,544,892 discloses a method of removing silicon dioxide in preference to silicon nitride from a surface of an article by chemical-mechanical polishing comprising polishing said surface using a polishing pad, water, abrasive particles, and an organic compound having both a carboxylic acid functional group and a second functional group selected from amines and halides.

U.S. Pat. No. 7,247,082 discloses a polishing composition comprising an abrasive, a pH adjusting agent, an improver of a selective ratio, and water, wherein the abrasive is contained in an amount of from 0.5 to 30% by weight, the pH adjusting agent is contained in an amount of from 0.01 to 3% by weight, the improver of a selective ratio is contained in an amount of 0.3 to 30% by weight, and water is contained in an amount of 45 to 99.49% by weight, wherein the weight % is based on the weight of the polishing composition, and wherein the improver is one or more compounds selected from the group consisting of methylamine, ethylamine, propylamine, isopropyl amine, dimethylamine, diethylamine, dipropylamine, diisopropylamine, ethylenediamine, 1,2-diaminopropane, 1,3-propanediamine, 1,4-butanediamine, hexamethylenediamine, N,N,N',N'-tetramethyl-1,6-diaminohexane, 6-(dimethylamino)-1-hexanol, bis(3-aminopropyl)amine, triethylenetetraamine, diethylene glycol bis(3-aminopropyl) ether, piperazine, and piperidine.

U.S. Pat. No. 8,778,203 discloses a method for selectively removing a target material on a surface of a substrate. The method comprises the steps of: providing a substrate comprising a target material and a non-target material; dissolving oxygen in a polishing solution to achieve a pre-determined dissolved oxygen concentration, the polishing solution having a pH of from about 5 to about 11, wherein the polishing solution comprises a plurality of abrasive silica particles, at least some of said plurality of abrasive silica particles are functionalized with n-(trimethoxysilylpropyl)isothiouronium chloride; maintaining, by continuously applying substantially pure oxygen to said polishing solution, the predetermined dissolved oxygen concentration of said polishing solution at or between approximately 8.6 mg/L and approximately 16.6 mg/L; disposing the polishing solution between a polishing pad and the surface; applying the polishing pad to the surface; and selectively removing a predetermined thickness of the target material; wherein varying the dissolved oxygen content of the polishing solution varies the removal ratio of target material to non-target material during the removal step.

U.S. Pat. No. 6,914,001 discloses s chemical mechanical polishing method comprising: contacting a surface of a semiconductor wafer with a surface of a polishing pad; supplying an aqueous solution containing abrasive particles, a removal rate accelerator, and different first and second passivation agents to an interface between the surface of the polishing pad and the surface of the semiconductor wafer, wherein the first passivation agent is an anionic, cationic or nonionic surfactant; and, rotating the surface of the semiconductor wafer relative to the surface of the polishing pad to remove an oxide material on the semiconductor wafer.

However, those prior disclosed Shallow Trench Isolation (STI) polishing compositions did not address the importance of oxide film removal rate boosting, SiN film removal rate suppressing and oxide trench dishing reducing and more uniform oxide trench dishing on the polished patterned wafers along with the high oxide vs nitride selectivity.

Therefore, it should be readily apparent from the foregoing that there remains a need within the art for compositions, methods and systems of STI chemical mechanical polishing that can afford the increased oxide film removal rates, the reduced SiN film removal rates and the reduced oxide trench dishing and more uniformed oxide trench dishing across various sized oxide trench features on polishing patterned wafers in a STI chemical and mechanical polishing (CMP) process, in addition to high removal rate of silicon dioxide as well as high selectivity for silicon dioxide to silicon nitride.

SUMMARY OF THE INVENTION

The present disclosure provides STI CMP polishing compositions, methods and systems that offer the increased and high oxide film removal rates with the use of relative low concentrations of ceria-coated inorganic oxide abrasives, the suppressed SiN film removal rates and the increased TEOS:SiN selectivity and the reduced oxide trench dishing on the polished patterned wafers.

In one aspect, the present disclosure provides a chemical mechanical polishing composition comprising: ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12.

In another aspect, the present disclosure provides a method of chemical mechanical polishing (CMP) a semiconductor substrate having at least one surface comprising a silicon oxide film, the method comprising the steps of: providing the semiconductor substrate; providing a polishing pad; providing the chemical mechanical polishing (CMP) composition comprising ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12; contacting the surface of the semiconductor substrate with the polishing pad and the chemical mechanical polishing composition; and polishing the least one surface comprising silicon dioxide.

In yet another aspect, the present invention provides a system for chemical mechanical polishing (CMP) a semiconductor substrate having at least one surface comprising silicon a oxide film, the system comprising: the semiconductor substrate; the chemical mechanical polishing (CMP) composition comprising: ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12; and a polishing pad, wherein the at least one surface comprising silicon oxide film is in contact with the polishing pad and the chemical mechanical polishing composition.

DETAILED DESCRIPTION OF THE INVENTION

In the global planarization of patterned STI structures, suppressing SiN removal rates, reducing oxide trench dishing across various sized oxide trench features, boosting oxide film removal rates, and using relative low concentrations of ceria-coated inorganic oxide particles as abrasives are the key factors to be considered.

The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

This invention relates to the Chemical mechanical polishing (CMP) compositions using dual chemical additives and low concentration of ceria-coated composite particles as abrasives for Shallow Trench Isolation (STI) CMP applications.

More specifically, the disclosed chemical mechanical polishing (CMP) composition for Shallow Trench Isolation (STI) CMP applications have a unique combination of using ceria-coated inorganic oxide abrasive particles and two types of chemical additives as dual chemical additives for oxide film removal rate boosting, oxide trench dishing reducing and nitride removal rate suppressing.

In one aspect, there is provided a chemical mechanical polishing composition comprising: ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12, preferably 3 to 10, more preferably 4 to 9, and most preferably 4.5 to 7.5.

Gelatin or a gelatin compound is a colorless and tasteless water-soluble collagen peptides derived from collagen obtained from various animal body parts or from synthetic chemistry. Gelatin compounds can be organic or inorganic and made either from natural sources or from synthetic chemistry. Gelatin contains approximately 50 or fewer amino acids with negative and positive charges bearing on the same molecule.

Gelatin can be made from, for example, animal skin, such as, cold water fish skin, porcine skin, and bovine skin.

The first type chemical additives employed in the compositions disclosed herein, is at least one gelatin compound (sometimes referred to herein as Type I), which primarily functions to increase the removal rate of oxide films and to reduce dishing defects.

The molecular structure of a gelatin molecule is shown as below:

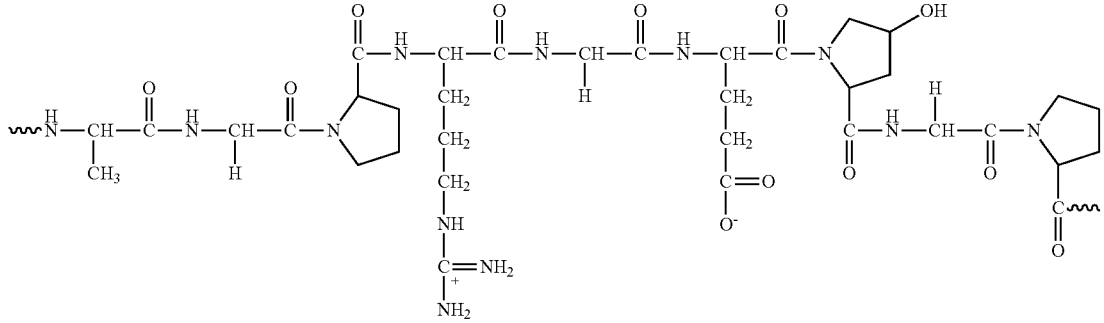

As the molecular structure shown for a gelatin compound, it contains negative and positive charges on the same molecule. Thus, the gelatin compounds can be described as the type of molecules with zwitterions which have both positive and negative charges at different locations throughout the molecule.

The second type of chemical additives employed in the compositions disclosed herein (sometimes referred to herein as Type II) is at least one non-ionic organic molecule having more than one hydroxyl functional group having a general molecular structure selected from the group consisting of

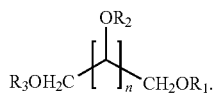
(a)

In the general molecular structure (a), n is selected from 2 to 5,000, preferably from 3 to 12, and more preferably from 4 to 6.

In these general molecular structures; $R_1$, $R_2$, and $R_3$ groups are the same or different atoms or functional groups.

$R_1$, $R_2$, and $R_3$ are independently selected from the group consisting of hydrogen, an alkyl group $C_xH_{2x+1}$, wherein x is from 1 to 12, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, an organic amine groups, and combinations thereof, wherein at least two of $R_1$, $R_2$, and $R_3$ are hydrogen atoms.

In another embodiment, the Type II chemical additive has a general structure shown below:

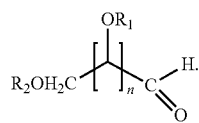
(b)

In this structure, one —CHO functional group is located at one end of the molecule as the terminal functional group; n is selected from 2 to 5,000, from 3 to 12, preferably from 4 to 7.

Each of $R_1$ and $R_2$ are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof, wherein one —CHO functional group is located at one end of the molecule as a terminal functional group.

In yet another embodiment, the chemical additives of Type II has a molecular structure selected from the group comprising of at least one (c), at least one (d), at least one (e) and combinations thereof;

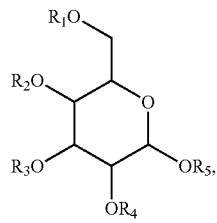
(c)

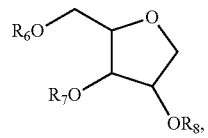
(d)

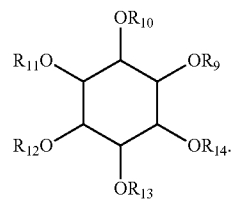
(e)

In these general molecular structures; $R_1$, $R_2$, $R_3$, $R_4$, $R_5$, $R_6$, $R_7$, $R_8$, $R_9$, $R_{10}$, $R_{11}$, $R_{12}$, $R_{13}$, and $R_{14}$ can be the same or different atoms or functional groups.

For structures (c), (d), and (e), $R_1$ to $R_{14}$ are each independently selected from the group consisting of hydrogen, an alkyl, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group, wherein at least two of $R_1$ to $R_{14}$ are hydrogen atoms.

Yet, in another embodiment, the Type II chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing more than one hydroxyl group.

The general molecular structure for the chemical additives is shown in (f):

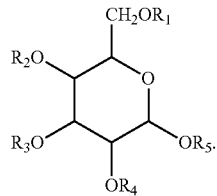
(f)

In structure (f), at least one of $R_1$ to $R_5$ in the general molecular structure (f) is a polyol molecular unit having a structure shown in (i):

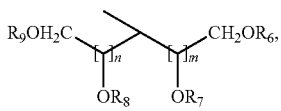

(i)

wherein n and m can be the same or different; m or n is independently selected from 1 to 5, preferably from 1 to 4, more preferably from 1 to 3, and most preferably from 1 to 2; $R_6$ to $R_9$ can be the same or different atoms or functional groups; each of $R_6$, $R_7$, $R_8$, and $R_9$ is independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and at least two of them are hydrogen atoms; and the remaining Rs in the group of $R_1$ to $R_5$ can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

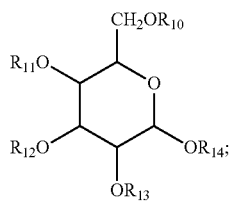

(ii)

wherein the structure (ii) is connected through oxygen carbon bond to structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof; and combinations thereof.

The general molecular structure (f) has at least two, at least four, or at least six of the Rs of groups $R_1$ to $R_9$ are hydrogen atoms. Thus, the chemical additives contain at least two, at least four, or at least six hydroxyl functional groups in their molecular structures.

In another embodiment, there is provides a chemical mechanical polishing composition, wherein the at least one non-ionic organic molecule having more than one hydroxyl functional group has a general molecular structure selected from the group consisting of:

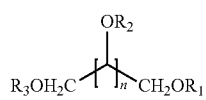

(a)

wherein for structure (a), $R_1$, $R_2$, and $R_3$ are independently selected from the group consisting of hydrogen, an alkyl group $C_xH_{2x+1}$, wherein x is from 1 to 12, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, an organic amine groups, and combinations thereof, wherein at least two of $R_1$, $R_2$, and $R_3$ are hydrogen atoms; and n is a number selected from the group consisting of from 2 to 5,000, from 3 to 12, and from 4 to 6;

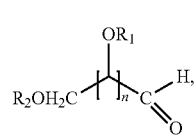

(b)

wherein for structure (b), $R_1$ and $R_2$ are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof, wherein one —CHO functional group is located at one end of the molecule as a terminal functional group; and n is a number selected from the group consisting of from 2 to 5,000, from 3 to 12, and from 4 to 7;

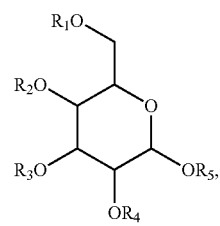

(c)

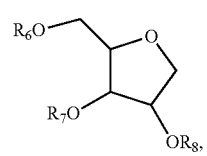

(d)

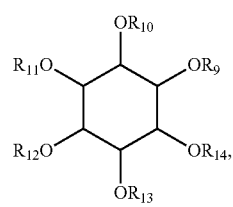

(e)

wherein, for structures (c), (d), and (e), $R_1$ to $R_{14}$ are each independently selected from the group consisting of hydrogen, an alkyl, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group, wherein at least two of $R_1$ to $R_{14}$ are hydrogen atoms;

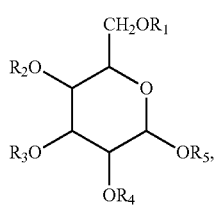

wherein, in structure (f), at least one of $R_1$ to $R_5$ is a polyol moiety having a structure (i):

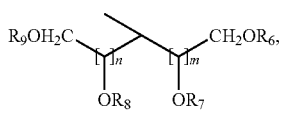

wherein, for structure (i), n and m is selected from 1 to 5; each of $R_6$, $R_7$, $R_8$, and $R_9$ is independently selected from the group consisting of hydrogen, an alkyl, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine, wherein at least two of $R_6$, $R_7$, $R_8$, and $R_9$ are hydrogen atoms; and in structure (f), each of $R_1$ to $R_5$ is independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, an organic amine, and a six-member ring polyol having a structure shown in (ii):

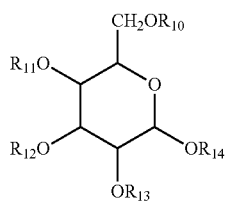

wherein the structure (ii) is connected through an oxygen-carbon bond to structure (f) by removing one of $R_{11}$ to $R_{14}$ and wherein, for structure (ii), each of $R_{10}$ to $R_{14}$ is independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine, wherein at least two of $R_1$ to $R_9$ in structure (f) are hydrogen atoms, wherein the wherein the at least one non-ionic organic molecule having more than one hydroxyl functional group is present in the composition at a concentration selected from the group consisting of from 0.001 wt. % to 2.0% wt. %, from 0.0025 wt. % to 1.0 wt. %, and from 0.05 wt. % to 0.5 wt. %.

Examples of the at least one non-ionic organic molecule having more than one hydroxyl functional group (also referred to herein as Type II chemical additives) include maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof. The preferred at least one non-ionic organic molecule having more than one hydroxyl functional group is selected from the group consisting of maltitol, lactitol, maltotritol, D-sorbitol, mannitol, dulcitol, iditol, D-(−)-Fructose, sucrose, ribose, Inositol, glucose. D-(+)-mannose, beta-lactose, and combinations thereof. The more preferred at least one non-ionic organic molecule having more than one hydroxyl functional group is selected from the group consisting of maltitol, lactitol, maltotritol, D-sorbitol, mannitol, dulcitol, D-(−)-Fructose, beta-lactose, and combinations thereof.

In some embodiments, the CMP polishing compositions can be made into two or more components and mixed at the point of use.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD (HDP), or spin on oxide films.

The substrate disclosed above can further comprises a silicon nitride surface. The removal selectivity of $SiO_2$: SiN is greater than silicon nitride is greater than 30, preferably greater than 60, and more preferably greater than 100.

Such dual chemical additive approach allows the use of relative low ceria-coated inorganic oxide particles and still achieving high and desirable oxide film removal rates due to the oxide film removal rate boosting effects from one of the dual chemical additives used in the invented polishing compositions.

The STI CMP compositions disclosed herein comprise from 0.0001 wt. % to 2.0% wt. %, preferably from 0.001 wt. % to 1.0 wt. %, more preferably from 0.002 wt. % to 0.5 wt. %, and most preferably from 0.0025 wt. % to 0.25 wt. % gelatin compounds as oxide film removal rate boosting agents, SiN film removal rate suppressing agents and oxide trenching dishing reducers.

The STI CMP compositions disclosed herein comprise from 0.001 wt. % to 2.0% wt. %, preferably from 0.0025 wt. % to 1.0 wt. %, and more preferably from 0.05 wt. % to 0.5 wt. % at least one non-ionic organic molecule having more than one hydroxyl functional group.

Dual chemical additives selected from two types of chemical additives (at least one gelatin and at least one non-ionic organic molecule having more than one hydroxyl functional group) and used in the same STI CMP polishing compositions provide the benefits of achieving high oxide film removal rates, low SiN film removal rates, high and tunable Oxide: SiN selectivity, and more importantly, providing significantly reduced oxide trench dishing and improving over polishing window stability on polishing patterned wafers.

The ceria-coated inorganic oxide particles include, but are not limited to, ceria-coated colloidal silica, ceria-coated alumina, ceria-coated titania, ceria-coated zirconia, or any other ceria-coated inorganic oxide particles. These ceria-coated inorganic oxide particles can be used as abrasives at relative low concentrations and still desirable and high oxide film removal rates can be achieved.

The particle sizes of these ceria-coated inorganic oxide particles in the disclosed invention herein are ranged from 10 nm to 1,000 nm, the preferred mean particle sized are ranged from 20 nm to 500 nm, the more preferred mean particle sizes are ranged from 50 nm to 250 nm.

The concentrations of these ceria-coated inorganic oxide particles can be in low concentration range which is from 0.01 wt. % to 2 wt. %, preferably from 0.02 wt. % to 0.5 wt. %, more preferably from 0.025 wt. % to 0.2 wt. %, and most preferably 0.05 wt. % to 0.1 wt. %.

The preferred ceria-coated inorganic oxide particles are ceria-coated colloidal silica particles.

The water-soluble solvent includes but is not limited to deionized (DI) water, distilled water, and alcoholic organic solvents.

The preferred water-soluble solvent is DI water.

The STI CMP composition may contain biocide from 0.0001 wt. % to 0.05 wt. %, preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The STI CMP composition may contain a pH adjusting agent.

An acidic or basic pH adjusting agent can be used to adjust the STI polishing compositions to the optimized pH value.

The pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The STI CMP composition contains 0 wt. % to 1 wt. %; preferably 0.01 wt. % to 0.5 wt. %, more preferably 0.1 wt. % to 0.25 wt. % pH adjusting agent.

In another aspect, there is provided a method of chemical mechanical polishing (CMP) a semiconductor substrate having at least one surface comprising a silicon oxide film, the method comprising the steps of: providing the semiconductor substrate; providing a polishing pad; providing the chemical mechanical polishing (CMP) composition comprising ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12; contacting the surface of the semiconductor substrate with the polishing pad and the chemical mechanical polishing composition; and polishing the least one surface comprising silicon dioxide.

In another aspect, there is provided a system for chemical mechanical polishing (CMP) a semiconductor substrate having at least one surface comprising silicon oxide film, the system comprising: the semiconductor substrate; the chemical mechanical polishing (CMP) composition comprising: ceria-coated inorganic oxide particles; at least one gelatin compound having a negative and a positive charge; at least one non-ionic organic molecule having more than one hydroxyl functional group; a solvent; and optionally, at least one biocide; and at least one pH adjuster, wherein the composition has a pH of from 2 to 12; and a polishing pad, wherein the at least one surface comprising silicon oxide film is in contact with the polishing pad and the chemical mechanical polishing composition.

The polished oxide films can be Chemical vapor deposition (CVD), Plasma Enhance CVD (PECVD), High Density Deposition CVD(HDP), or spin on oxide films.

The substrate disclosed above can further comprises a silicon nitride surface. The removal selectivity of $SiO_2$: SiN is greater than 40, preferably greater than 50, and more preferably greater than 90.

In another aspect, there is provided a method of chemical mechanical polishing (CMP) a substrate having at least one surface comprising silicon dioxide using the chemical mechanical polishing (CMP) composition described above in Shallow Trench Isolation (STI) process. The polished oxide films can be CVD oxide, PECVD oxide, High density oxide, or Spin on oxide films.

The following non-limiting examples are presented to further illustrate the present invention.

EXAMPLES

CMP Methodology

In the examples presented below, CMP experiments were run using the procedures and experimental conditions given below.

Glossary Components

Ceria-coated Silica: used as abrasive having a particle size of approximately 100 nanometers (nm); such ceria-coated silica particles can have a particle size of ranged from approximately 80 nanometers (nm) to 200 nanometers (nm);

Ceria-coated Silica particles (with varied sizes) were supplied by JGCC Inc. in Japan. These ceria-coated colloidal silica particles are dispersed in aqueous solution with alkaline pH, typically >9.0 which showed highly negative zeta potential in wide pH condition range including all pH conditions being tested in this invention.

Chemical additives, such as gelatin compound s, maltitol, D-Fructose, Dulcitol, D-sorbitol and other chemical raw materials were supplied by Sigma-Aldrich, St. Louis, Mo., or supplied by Evonik Industries in Allentown, Pa.

TEOS: tetraethyl orthosilicate

Polishing Pad: Polishing pad, IC1010 and other pads were used during CMP, supplied by DOW, Inc.

Parameters

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: composition flow, ml/min Wt. %: weight percentage (of a listed component)

TEOS: SiN Selectivity: (removal rate of TEOS)/(removal rate of SiN)

HDP: high density plasma deposited TEOS

TEOS or HDP Removal Rates: Measured TEOS or HDP removal rate at a given down pressure. The down pressure of the CMP tool was 3.0 psi in the examples listed below.

SiN Removal Rates: Measured SiN removal rate at a given down pressure. The down pressure of the CMP tool was 3.0 psi in the examples listed below.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An 101000 pad supplied by DOW, Inc, 451 Bellevue Rd., Newark, Del. 19713 was used on platen 1 for blanket and pattern wafer studies.

The 101010 pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Wafers

Polishing experiments were conducted using PECVD, LECVD silicon oxide or silicon nitride wafers, or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 3.0 psi DF, composition flow; 200 ml/min. The polishing pad used for testing was IC1010 pad which was supplied by Dow Chemicals.

The composition was used in polishing experiments on patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

TEOS: SiN Selectivity: (removal rate of TEOS)/(removal rate of SiN) obtained from the STI CMP polishing compositions were tunable.

In the following working examples, three reference STI polishing compositions were prepared. Reference 1 (ref. 1) composition comprised 0.2 wt. % ceria-coated silica, a biocide ranging from 0.0001 wt. % to 0.05 wt. %, and deionized water. Ref. 1 had a pH of 7.0. Reference 2 (ref. 2) composition comprised 0.2 wt. % ceria-coated silica, a biocide ranging from 0.0001 wt. % to 0.05 wt. %, 0.15 wt. % D-Sorbitol at and deionized water. Ref. 2 also had a pH of 7.0. Reference 3 (ref. 3) composition comprised 0.2 wt. % ceria-coated silica, a biocide ranging from 0.0001 wt. % to 0.05 wt. %, 0.0083 wt. % Gelatin from fish skin and deionized water. Ref. 3 had a pH of 7.0.

The working polishing compositions using dual chemical additives were prepared with 0.2 wt. % ceria-coated silica, 0.15 wt. % D-Sorbitol, 0.0083 wt. % gelatin made from cold water fish skin, a biocide ranging from 0.0001 wt. % to 0.05 wt. %, and deionized water. The composition had a pH of 7.0.

Example 1

In Example 1, the polishing compositions used for oxide polishing were shown in Table 1.

The removal rates (RR at Å/min) for different films were tested and the effects of dual chemical additives on the film removal rates and TEOS: SiN film selectivity were observed and listed in Table 1.

The polishing conditions used were: Dow's IC1010 pad at 3.0 psi DF with table/head speed at 87/93 rpm and ex-situ conditioning.

As the results shown in Table 1, the working composition with dual chemical additives effectively boosted TEOS and HDP film removal rates.

TABLE 1

Effects of dual chemical additives on
Film RR (Å/min.) & TEOS:SiN Selectivity

| Compositions | TEOS RR (Å/min) | HDP RR (Å/min) | PECVD SiN RR (Å/min) | TEOS:SiN Selectivity |
|---|---|---|---|---|
| 0.2% Ceria-coated Silica pH 7.0 | 3168 | 2874 | 400 | 7.9:1 |
| 0.2% Ceria-coated Silica + 0.15% D-Sorbitol pH 7.0 | 2607 | 2641 | 65 | 40.1:1 |
| 0.2% Ceria-coated Silica + 0.0083% Gelatin from Fish Skin pH 7.0 | 5310 | 5593 | 1254 | 4.2:1 |
| 0.2% Ceria-coated Silica + 0.15% D-Sorbitol + 0.0083% Gelatin from Fish Skin pH 7.0 | 5171 | 5203 | 55 | 94.1:1 |

Type I chemical additive, Gelatin made from cold water fish skin in ref. 3 polishing composition, boosted oxide film removal rates significantly while comparing to the ref.1 polishing composition which only used same concentration of ceria-coated silica abrasives under same pH condition.

The Type I chemical additive, Gelatin made from cold water fish skin in ref. 3 polishing composition, also boosted SiN film removal rates significantly while comparing to the ref.1 polishing composition which only used same concentration of ceria-coated silica abrasives under same pH condition.

The Type II chemical additive, D-sorbitol, in ref. 2 polishing composition, suppressed SiN film removal rates significantly while comparing to the ref.1 polishing composition which only used same concentration of ceria-coated silica abrasives under same pH condition. Thus, TEOS: SiN selectivity was increased from 8:1 to 40:1.

When the Type I chemical additive, Gelatin made from cold water fish skin, and Type II chemical additive, D-sorbitol, were used together in the working polishing composition, the oxide film removal rates were boosted and SiN film removal rates were suppressed, thus, TEOS: SiN selectivity was increased significantly from 8:1 from Ref.1 sample to 94:1 for working polishing composition. 94:1 TEOS: SiN selectivity for the dual chemical additives based polishing compositions are much higher than the TEOS: SiN selectivity than the polishing compositions only used one of Type I or one of Type II chemical additive or not use any chemical additive.

Example 2

In Example 2, the polishing compositions used for oxide polishing were the same as shown in Table 1.

The effects of dual chemical additives on the oxide trenching dishing vs different over polishing times were tested and the results were listed in Table 2.

TABLE 2

Effects of dual chemical additives on Oxide Trench Dishing (Å) vs OP Times (Sec.)

| Compositions | OP Times (Sec.) | 100 um pitch dishing | 200 um pitch dishing |
|---|---|---|---|
| 0.2% Ceria-coated Silica pH 7.0 | 0 | 129 | 308 |
|  | 60 | 702 | 888 |
|  | 120 | 1091 | 1364 |
| 0.2% Ceria-coated Silica + 0.15% D-Sorbitol pH 7.0 | 0 | 61 | 153 |
|  | 60 | 196 | 289 |
|  | 120 | 331 | 441 |
| 0.2% Ceria-coated Silica + 0.0083% Gelatin from Fish Skin pH 7.0 | 0 | 93 | 302 |
|  | 60 | 730 | 938 |
|  | 120 | 791 | 1065 |
| 0.2% Ceria-coated Silica + 0.15% D-Sorbitol + 0.0083% Gelatin from Fish Skin pH 7.0 | 0 | 81 | 186 |
|  | 60 | 224 | 334 |
|  | 120 | 324 | 448 |

As the results shown in Table 2, the polishing compositions using dual chemical additives significantly reduced oxide trench dishing vs different over polishing times while comparing the reference sample which only used ceria-coated silica abrasives.

While comparing dual chemical additives based STI polishing composition with the STI polishing composition ref. 2 which used a single chemical additive, D-sorbitol, similar oxide pitch dishing obtained vs different over polishing times across different sized oxide pitches. Such results showed the gelatin as second chemical additive in the dual chemical additives based STI polishing compositions boosted oxide film removal rates significantly, but still maintained low oxide trench dishing performances.

Example 3

In Example 3, the polishing compositions used for oxide polishing were the same as those shown in Table 1.

The effects of dual chemical additives on the slopes of oxide pitch dishing vs over polishing amount were tested and the results were listed in Table 3.

TABLE 3

Effects of dual chemical additives on Slopes of Pitch Dishing (Å)/OP Amt.

| Compositions | P100 Dishing/OP Amt. Slope | P200 Dishing/OP Amt. Slope |
|---|---|---|
| 0.2% Ceria-coated Silica pH 7.0 | 0.17 | 0.18 |
| 0.2% Ceria-coated Silica + 0.15% D-Sorbitol pH 7.0 | 0.05 | 0.05 |
| 0.2% Ceria-coated Silica + 0.0083% Gelatin from Fish Skin pH 7.0 | 0.06 | 0.07 |
| 0.2% Ceria-coated Silica + 0.15% D-Sorbitol + 0.0083% Gelatin from Fish Skin pH 7.0 | 0.03 | 0.04 |

As the results shown in Table 3, using dual chemical additives in the polishing composition significantly reduced the slopes of oxide pitch dishing over the over polishing amount while comparing the reference sample which only used ceria-coated silica abrasives or the reference samples which only use a single type of chemical additive in the polishing compositions.

The results listed in Table 3 also shown that either D-Sorbitol or Gelatin from fish skin can be used as a single chemical additive in the polishing compositions to provide significantly lower oxide trench dishing vs over polishing removal amounts while comparing the polishing composition only used ceria-coated silica abrasives.

Example 4

In Example 4, the polishing compositions used for oxide polishing were shown in Table 4.

Three reference STI polishing compositions were prepared. Reference 1 (ref. 1) composition comprised 0.2 wt. % ceria-coated silica, a biocide ranging from 0.0001 wt. % to 0.05 wt. %, and deionized water. Ref. 1 had a pH of 7.0. Reference 2 (ref. 2) composition comprised 0.2 wt. % ceria-coated silica, a biocide ranging from 0.0001 wt. % to 0.05 wt. %, 0.28 wt. % Maltitol and deionized water. Ref. 2 also had a pH of 7.0. Reference 3 (ref. 3) composition comprised 0.2 wt. % ceria-coated silica, a biocide ranging from 0.0001 wt. % to 0.05 wt. %, 0.0083 wt. % Gelatin from fish skin and deionized water. Ref. 3 had a pH of 7.0.

The working polishing compositions using dual chemical additives were prepared with 0.2 wt. % ceria-coated silica, 0.28 wt. % Maltitol, 0.0083 wt. % gelatin made from cold water fish skin, a biocide ranging from 0.0001 wt. % to 0.05 wt. %, and deionized water. The composition had a pH of 7.0.

The removal rates (RR at Å/min) for different films were tested. The effects of dual chemical additives on the film removal rates and TEOS: SiN film selectivity were observed and listed in Table 4.

The polishing step conditions used were: Dow's 101010 pad at 3.0 psi DF with table/head speed at 87/93 rpm and ex-situ conditioning.

TABLE 4

Effects of dual chemical additives on Film RR (Å/min.) TEOS:SiN Selectivity

| Compositions | TEOS RR (Å/min) | HDP RR (Å/min) | PECVD SiN RR (Å/min) | TEOS:SiN Selectivity |
|---|---|---|---|---|
| 0.2% Ceria-coated Silica pH 7.0 | 3168 | 2874 | 400 | 7.9:1 |
| 0.2% Ceria-coated Silica + 0.28% Maltitol pH 7.0 | 2504 | 2552 | 42 | 59.6:1 |
| 0.2% Ceria-coated Silica + 0.0083% Gelatin from Fish Skin pH 7.0 | 5310 | 5593 | 1254 | 4.2:1 |
| 0.2% Ceria-coated Silica + 0.28% Maltitol + 0.0083% Gelatin from Fish Skin pH 7.0 | 5034 | 5475 | 41 | 122.8:1 |

As the results shown in Table 4, using dual chemical additives effectively boosted TEOS and HDP film removal rates.

Type I chemical additive, Gelatin made from cold water fish skin in ref. 3 polishing composition, boosted oxide film removal rates significantly while comparing to the ref.1 polishing composition which only used same concentration of ceria-coated silica abrasives under same pH condition.

Type I chemical additive, Gelatin made from cold water fish skin in ref. 3 polishing composition, also boosted SiN film removal rates significantly while comparing to the ref.1 polishing composition which only used same concentration of ceria-coated silica abrasives under same pH condition.

Type II chemical additive, Maltitol, in ref. 2 polishing composition, suppressed SiN film removal rates significantly while comparing to the ref.1 polishing composition which only used same concentration of ceria-coated silica abrasives under same pH condition. Thus, TEOS: SiN selectivity was increased from 8:1 to 60:1.

When Type I chemical additive, Gelatin made from cold water fish skin and Type II chemical additive, Maltitol, were used together in the working polishing composition, the oxide film removal rates were boosted and SiN film removal rates were remained low, thus, TEOS: SiN selectivity was increased from 8:1 from Ref.1 sample to 123:1 for working polishing composition. 123:1 TEOS: SiN selectivity for the dual chemical additives based polishing compositions are much higher than the TEOS: SiN selectivity than the polishing compositions only used one of Type I or one of Type II chemical additive or not use any chemical additive.

Example 5

In Example 5, the polishing compositions used for oxide polishing were shown in Table 5.

The three reference samples were used for polishing tests are the same as those reference samples used in Example 4. The working polishing composition was made using 0.2 wt. % ceria-coated silica, a biocide ranging from 0.0001 wt. % to 0.05 wt. %, 0.28 wt. % maltitol and 0.0083 wt. % Gelatin made from cold water fish skin, and deionized water. The composition had a pH of 7.0.

The oxide trenching dishing vs different over polishing times was tested using these samples. The results were listed in Table 5.

TABLE 5

Effects of dual additives on Oxide Trench Dishing (Å) vs OP Times (Sec.)

| Compositions | OP Times (Sec.) | 100 um pitch dishing | 200 um pitch dishing |
| --- | --- | --- | --- |
| 0.2% Ceria-coated Silica pH 7.0 | 0 | 129 | 308 |
|  | 60 | 702 | 888 |
|  | 120 | 1091 | 1364 |
| 0.2% Ceria-coated Silica + | 0 | 92 | 214 |
| 0.28% Maltitol pH 7.0 | 60 | 176 | 318 |
|  | 120 | 275 | 428 |
| 0.2% Ceria-coated Silica + 0.0083% Gelatin | 0 | 93 | 302 |
| from Fish Skin pH 7.0 | 60 | 730 | 938 |
|  | 120 | 791 | 1065 |
| 0.2% Ceria-coated Silica + 0.28% Maltitol + | 0 | 83 | 216 |
| 0.0083% Gelatin from Fish Skin pH 7.0 | 60 | 224 | 430 |
|  | 120 | 396 | 575 |

As the results shown in Table 5, the use of dual additives in the polishing compositions provided significantly increased TEOS and HDP film removal rates, but still afforded very similar oxide trench dishing vs over polishing times on P100 micron or P200 micron pitch.

Example 6

In Example 6, the polishing compositions used for oxide polishing were shown in Table 6.

The three reference samples were used for polishing tests are the same as those reference samples used in Example 4. The working polishing composition was made using 0.2 wt. % ceria-coated silica, a biocide ranging from 0.0001 wt. % to 0.05 wt. %, 0.28 wt. % maltitol and 0.0083 wt. % Gelatin from cold water fish skin, and deionized water. The composition had a pH of 7.0.

The effects of dual additives on the slopes of oxide trenching dishing vs over polishing amount using the working samples with same concentrations of ceria-coated silica abrasives vs the reference sample were tested and the results were listed in Table 6.

TABLE 6

Effects of Dual Chemical Additives on Slopes of Pitch Dishing (Å)/OP Amt.

| Compositions | P100 Dishing/OP Amt. Slope | P200 Dishing/OP Amt. Slope |
| --- | --- | --- |
| 0.2% Ceria-coated Silica pH 7.0 | 0.17 | 0.18 |
| 00.2% Ceria-coated Silica + 0.28% Maltitol pH 7.0 | 0.04 | 0.04 |
| 0.2% Ceria-coated Silica + 0.0083% Gelatin from Fish Skin pH 7.0 | 0.06 | 0.07 |
| 0.2% Ceria-coated Silica + 0.28% Maltitol + 0.0083% Gelatin from Fish Skin pH 7.0 | 0.03 | 0.03 |

As the results shown in Table 6, the addition of dual additives in the polishing compositions provided significantly increased TEOS and HDP film removal rates, and lowest slopes of oxide pitch dishing over the over polishing amount while comparing the reference sample which only used ceria-coated silica abrasives or only used a single chemical additive in the polishing compositions.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:
   0.01 wt. % to 20 wt. % of ceria-coated inorganic oxide particles;
   0.001 wt. % to 2.0% wt. % of at least one gelatin compound having a negative and a positive charge;
   0.001 wt. % to 2.0% wt. % of at least one non-ionic organic molecule having more than one hydroxyl functional group;
   a solvent; and
   optionally, from 0.0001 wt. % to 0.05 wt. % of at least one biocide; and from 0 wt. % to 1 wt. % of at least one pH adjuster,
   wherein the composition has a pH of from 2 to 12.

2. The chemical mechanical polishing composition of claim 1, wherein the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof, wherein the particles are present in the composition at a concentration range of from 0.05 wt. % to 10 wt. %.

3. The chemical mechanical polishing composition of claim 1, wherein the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof, wherein the particles are present in the composition at a concentration range of from 0.05 wt. % to 0.1 wt. %.

4. The chemical mechanical polishing composition of claim 1, wherein the solvent is selected from the group consisting of deionized (DI) water, distilled water, and alcoholic organic solvents.

5. The chemical mechanical polishing composition of claim 1, wherein the at least one non-ionic organic molecule having more than one hydroxyl functional group has a general molecular structure selected from the group consisting of:

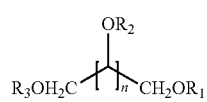
(a)

wherein for structure (a), $R_1$, $R_2$, and $R_3$ are independently selected from the group consisting of hydrogen, an alkyl group $C_xH_{2x+1}$, wherein x is from 1 to 12, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, an organic amine groups, and combinations thereof, wherein at least two of $R_1$, $R_2$, and $R_3$ are hydrogen atoms; and n is a number selected from the group consisting of from 2 to 5,000, from 3 to 12, and from 4 to 6;

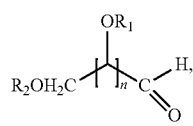
(b)

wherein for structure (b), $R_1$ and $R_2$ are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof, wherein one —CHO functional group is located at one end of the molecule as a terminal functional group; and n is a number selected from 2 to 5,000;

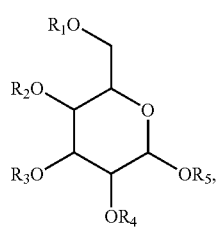
(c)

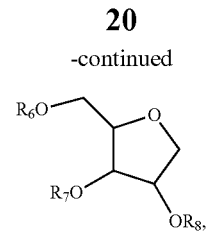
(d)

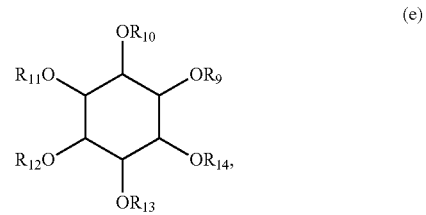
(e)

wherein, for structures (c), (d), and (e), $R_1$ to $R_{14}$ are each independently selected from the group consisting of hydrogen, an alkyl, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine group, wherein at least two of $R_1$ to $R_{14}$ are hydrogen atoms;

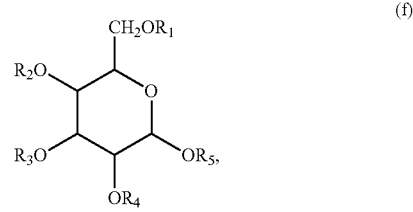
(f)

wherein, in structure (f), at least one of $R_1$ to $R_5$ is a polyol moiety having a structure (i):

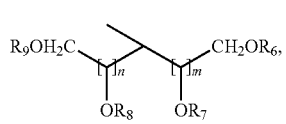
(i)

wherein, for structure (i), n and m is selected from 1 to 5; each of $R_6$, $R_7$, $R_8$, and $R_9$ is independently selected from the group consisting of hydrogen, an alkyl, an alkoxy, an organic group with one or more hydroxyl groups, a substituted organic sulfonic acid, a substituted organic sulfonic acid salt, a substituted organic carboxylic acid, a substituted organic carboxylic acid salt, an organic carboxylic ester, and an organic amine, wherein at least two of $R_6$, $R_7$, $R_8$, and $R_9$ are hydrogen atoms; and in structure (f), each of $R_1$ to $R_5$ is independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, an organic amine, and a six-member ring polyol having a structure shown in (ii):

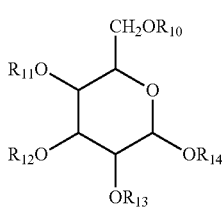

wherein the structure (ii) is connected through an oxygen-carbon bond to structure (f) by removing one of $R_{11}$ to $R_{14}$ and wherein, for structure (ii), each of $R_{10}$ to $R_{14}$ is independently selected from the group consisting of hydrogen, an alkyl, an alkoxy, an organic group with one or more hydroxyl groups, a substituted organic sulfonic acid or salt, a substituted organic carboxylic acid or salt, an organic carboxylic ester, and an organic amine, wherein at least two of $R_1$ to $R_9$ in structure (f) are hydrogen atoms, wherein the wherein the at least one non-ionic organic molecule having more than one hydroxyl functional group is present in the composition at a concentration of from 0.0025 wt. % to 1.0 wt. %.

6. The chemical mechanical polishing composition of claim 1, wherein the composition further comprises the at least one biocide, wherein the biocide comprises 5-chloro-2-methyl-4-isothiazolin-3-one and 2-methyl-4-isothiazolin-3-one, wherein the biocide is present at a concentration of from 0.0005 wt. % to 0.025 wt. %.

7. The chemical mechanical polishing composition of claim 1, wherein the composition comprises the at least one pH adjusting agent wherein the pH adjusting agent is selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions, and wherein the pH adjusting agent is present in the composition at a composition of from 0.01 wt. % to 0.5 wt. %.

8. The chemical mechanical polishing composition of claim 1, comprising ceria-coated colloidal silica; the at least one the gelatin compound is selected from the group consisting of cold water fish skin, porcine skin, bovine skin, and combinations thereof; and the at least one non-ionic organic molecule having more than one hydroxyl functional group is selected from the group consisting of Dulcitol, D-sorbitol, Maltitol, Lactitol, and combinations thereof.

9. The composition of claim 1 wherein the at least one non-ionic organic molecule having more than one hydroxyl functional group is selected from the group consisting of maltitol, lactitol, maltotritol, ribitol, D-sorbitol, mannitol, dulcitol, iditol, D-(-)-fructose, sorbitan, sucrose, ribose, Inositol, glucose, D-arabinose, L-arabinose, D-mannose, L-mannose, meso-erythritol, beta-lactose, arabinose, D-(+)-mannose, and combinations thereof.

10. The composition of claim 9 wherein the at least one non-ionic organic molecule having more than one hydroxyl functional group is selected from the group consisting of maltitol, lactitol, maltotritol, D-sorbitol, mannitol, dulcitol, D-(-)-Fructose, beta-lactose, and combinations thereof.

11. The chemical mechanical polishing composition of claim 1 wherein the pH is from 3 to 10.

12. The chemical mechanical polishing composition of claim 11 wherein the pH is from 4 to 9.

13. The chemical mechanical polishing composition of claim 12 wherein the pH is from 4.5 to 7.5.

14. The chemical mechanical polishing composition of claim 1, wherein the at least one gelatin compound is present in the composition at a concentration of from 0.001 wt. % to 1.0 wt. %.

15. The chemical mechanical polishing composition of claim 14, wherein the at least one gelatin compound is made from animal skin comprising cold water fish skin, porcine skin, or bovine skin.

16. The chemical mechanical polishing composition of claim 14, wherein the at least one gelatin compound comprises a compound having the following chemical structure:

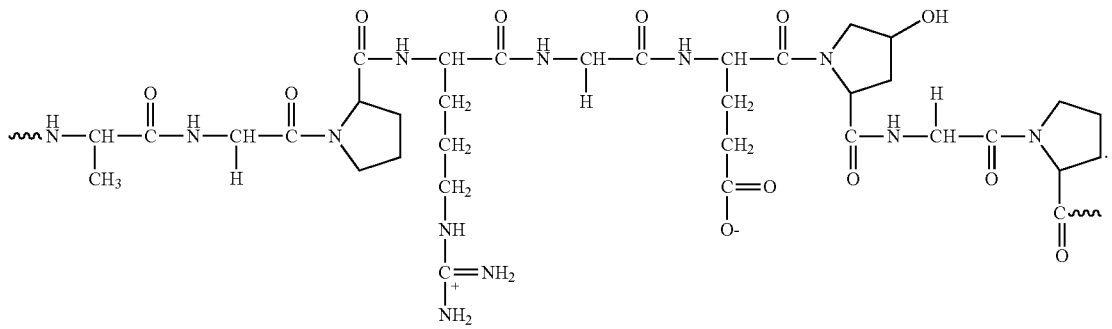

17. A method of chemical mechanical polishing (CMP) a semiconductor substrate having at least one surface comprising a silicon oxide film, the method comprising the steps of:
  providing the semiconductor substrate;
  providing a polishing pad;
  providing the chemical mechanical polishing (CMP) composition of claim 1;
  contacting the surface of the semiconductor substrate with the polishing pad and the chemical mechanical polishing composition; and
  polishing the least one surface comprising silicon dioxide.

18. The method of claim 17, wherein the silicon oxide film is a $SiO_2$ film.

19. The method of claim 18, wherein the semiconductor substrate further comprises a silicon nitride surface, and a removal selectivity of silicon oxide:silicon nitride is greater than 40.

20. The method of claim 19, wherein the removal selectivity of silicon oxide:silicon nitride is greater than 90.

21. A system for chemical mechanical polishing (CMP) a semiconductor substrate having at least one surface comprising silicon a oxide film, the system comprising:
   a. the semiconductor substrate;
   b. the chemical mechanical polishing (CMP) composition of claim 1; and
   c. a polishing pad,
      wherein the at least one surface comprising silicon oxide film is in contact with the polishing pad and the chemical mechanical polishing composition.

22. The system of claim 21, wherein the silicon oxide film is a $SiO_2$ film.

23. The system of claim 22, wherein the semiconductor substrate further comprises a silicon nitride surface, and removal selectivity of silicon oxide:silicon nitride is greater than 40.

24. The system of claim 23, wherein the removal selectivity of silicon oxide:silicon nitride is greater than 90.

* * * * *